(12) United States Patent
Pham et al.

(10) Patent No.: US 8,877,588 B2
(45) Date of Patent: Nov. 4, 2014

(54) METHODS OF FORMING A THREE-DIMENSIONAL SEMICONDUCTOR DEVICE WITH A DUAL STRESS CHANNEL AND THE RESULTING DEVICE

(71) Applicant: GLOBALFOUNDRIES Inc., Grand Cayman, KY (US)

(72) Inventors: Daniel T. Pham, Clifton Park, NY (US); Werner Juengling, Saratoga Springs, NY (US); William J. Taylor, Jr., Clifton Park, NY (US); Robert Miller, Yorktown Heights, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 32 days.

(21) Appl. No.: 13/764,115

(22) Filed: Feb. 11, 2013

(65) Prior Publication Data
US 2014/0225168 A1    Aug. 14, 2014

(51) Int. Cl.
*H01L 21/00* (2006.01)
*H01L 29/78* (2006.01)
*H01L 29/66* (2006.01)

(52) U.S. Cl.
CPC ........ *H01L 29/66795* (2013.01); *H01L 29/785* (2013.01)
USPC .......................................... 438/268; 438/270

(58) Field of Classification Search
USPC ................................................ 438/268–272
See application file for complete search history.

(56) References Cited

U.S. PATENT DOCUMENTS

| | | | |
|---|---|---|---|
| 6,762,448 B1 * | 7/2004 | Lin et al. | 257/302 |
| 2004/0198031 A1 * | 10/2004 | Lin et al. | 438/585 |
| 2009/0101982 A1 * | 4/2009 | Nagatomo | 257/368 |
| 2011/0175166 A1 * | 7/2011 | Bedell et al. | 257/351 |

OTHER PUBLICATIONS

Shin et al., "Study of Bending-Induced Strain Effects on MuGFET Performance," IEEE Electron Device Letters, 27:671-673, Aug. 2006.

* cited by examiner

*Primary Examiner* — Richard Booth
(74) *Attorney, Agent, or Firm* — Amerson Law Firm, PLLC

(57) ABSTRACT

One method includes forming first and second spaced-apart trenches extending at least partially into a semiconducting substrate defining a fin structure for the device, forming a stress-inducing material having a first type of stress in the first trench, forming a second stress-inducing material in the second trench, the second stress-inducing material having a second stress that is a different than the first type of stress, and forming a gate structure around a portion of the fin structure. One device includes first and second spaced-apart trenches in a semiconducting substrate defining at least a portion of a fin for the device, a stress-inducing material having a first type of stress in the first trench, a second stress-inducing material in the second trench, the second stress-inducing material having a second stress that is a different type than the first stress, and a gate structure around a portion of the fin structure.

25 Claims, 10 Drawing Sheets

METHODS OF FORMING A THREE-DIMENSIONAL SEMICONDUCTOR DEVICE WITH A DUAL STRESS CHANNEL AND THE RESULTING DEVICE

BACKGROUND OF THE INVENTION

1. Field of the Invention

Generally, the present disclosure relates to the manufacture of sophisticated semiconductor devices, and, more specifically, to various methods of forming a three-dimensional (3D) semiconductor device with a dual stress channel, such as, for example, an enhanced performance FinFET device with a dual stress channel.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

Device designers have recently employed channel stress engineering techniques on FETs to improve the electrical performance of such devices, i.e., to improve the mobility of the charge carriers. More specifically, such stress engineering techniques generally involve creating a tensile stress in the channel region for an NMOS transistor and creating a compressive stress in the channel region for a PMOS transistor. Stress engineering techniques typically involve the formation of specifically made silicon nitride layers that are selectively formed above appropriate transistors, i.e., a layer of silicon nitride that is intended to impart a tensile stress in the channel region of an NMOS transistor would only be formed above the NMOS transistors. Conversely, for PMOS transistors, a layer of silicon nitride that is intended to impart a compressive stress in the channel region of a PMOS transistor is formed above the PMOS transistors. The techniques employed in forming such nitride layers with the desired tensile or compressive stress are well known to those skilled in the art. Other techniques employed to induce the desired stress on a FET involves forming recesses or cavities in the substrate where source/drain regions will be formed and thereafter forming a stress-inducing material, such as an epitaxially formed silicon/germanium material, in the cavities to induce the desired stress in the channel region of the transistor.

In general, stress engineering techniques for FinFETs have generally involved forming stress-inducing layers of material over or within the source and drain regions of the FinFET. As noted above, a FinFET is a three-dimensional device where stress engineering techniques may be very complex to implement. Therefore, there is a need for various methods and structures to improve carrier mobility in FinFETs.

Device manufacturers are under constant pressure to produce integrated circuit products with increased performance and lower production cost relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices.

The present disclosure is directed to various methods of forming a three-dimensional (3D) semiconductor device with a dual stress channel.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a three-dimensional (3D) semiconductor device with a dual stress channel. In one example, the method includes forming first and second spaced-apart trenches that extend at least partially into a semiconducting substrate, wherein the first and second trenches define a fin structure for the device, forming a first stress-inducing material having a first type of stress in the first trench, forming a second stress-inducing material in the second trench, wherein the second stress-inducing material has a second stress that is a different type than the first type of stress, and forming a gate structure around a portion of the fin structure.

Another illustrative method includes forming a patterned mask layer above a semiconducting substrate, performing at least one first etching process through the patterned mask layer to form a first trench in the substrate, forming a first stress-inducing material having a first type of stress in the first trench and removing a portion of the first patterned masking layer. In this embodiment, the method further comprises, after removing the portion of the first patterned masking layer, performing at least one second etching process to form a second trench in the substrate, wherein the first and second trenches define a fin structure for the device, forming a second stress-inducing material in the second trench, wherein the second stress-inducing material has a second stress that is a different type than the first type of stress, performing at least one process operation to reduce a thickness of the first and second stress-inducing materials so as to expose a desired portion of the fin structure, and forming a gate structure around a portion of the exposed fin structure.

One illustrative device disclosed herein includes first and second spaced-apart trenches in a semiconducting substrate, wherein the first and second trenches define at least a portion of a fin for the device, a first stress-inducing material having a first type of stress positioned in the first trench, a second stress-inducing material in the second trench, wherein the second stress-inducing material has a second stress that is a different type than the first type of stress, and a gate structure around a portion of the fin structure.

BRIEF DESCRIPTION OF THE DRAWINGS

The disclosure may be understood by reference to the following description taken in conjunction with the accompanying drawings, in which like reference numerals identify like elements, and in which.

Figure 1A:
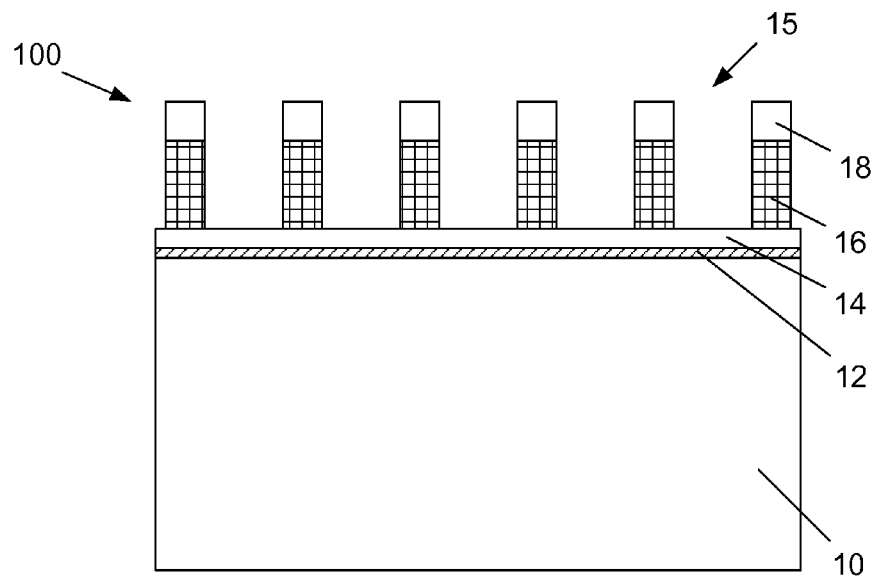
FIGS. 1A-1T depict various novel methods disclosed herein of forming a three-dimensional (3D) semiconductor device with a dual stress channel, and various illustrative embodiments of such devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a three-dimensional (3D) semiconductor device with a dual stress channel. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative 3D device 100 at an early stage of manufacturing that is formed above a semiconducting substrate 10. In the depicted example, the 3D device 100 will be disclosed in the context of forming an illustrative FinFET device. However, the present invention should not be considered to be limited to the illustrative FinFET device examples depicted herein. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all semiconductor structures. The substrate 10 may also be made of materials other than silicon.

In general, the present disclosure is directed to forming a 3D device with a dual stressed channel. After a complete reading of the present application, those skilled in the art will appreciate that the methods disclosed herein provide device designers with great flexibility in designing advanced integrated circuit products that employ such devices. In some embodiments, a tensile stress-inducing material will be formed adjacent one side of the channel, while a compressive stress-inducing material will be formed adjacent the opposite side of the channel, or vice-versa. In other applications, a neutral stress-inducing material may be formed adjacent one side of the channel, while a tensile or compressive stress-inducing material may be formed adjacent the opposite side of the channel. Thus, the inventions disclosed herein should not be considered as being limited to a device with any particular combination or arrangement of stress-inducing materials positioned adjacent the channel of an illustrative 3D device.

With continuing reference to FIG. 1A, at this point in the manufacturing process, a layer of silicon dioxide 12, e.g., a pad oxide layer, and a layer of silicon nitride 14, e.g., a pad nitride layer, have been formed above the substrate 10 by performing known deposition techniques, e.g., chemical vapor deposition (CVD) processes, atomic layer deposition (ALD) processes, etc. The thickness of the layers 12, 14 may vary depending upon the particular application. Also depicted in FIG. 1A is a patterned mask layer 15, such as a patterned hard mask layer, that has been formed above the substrate 10 using known photolithography and etching techniques. In the depicted example, the patterned mask layer 15 is comprised of a first layer 16 and a second layer 18. The patterned mask layer 15 is intended to be representative in nature as it could by comprised of a variety of materials, such as, for example, silicon nitride, silicon oxynitride, hafnium oxide, etc., or it could be a soft mask layer for which certain organic polymeric materials that are resistant to the etching chemicals and processes are commonly used. For construction of 3D devices in substrates other than silicon or silicon/germanium, other hard mask materials are known and may be considered by those skilled in the art to be more appropriate, depending upon the particular application. Moreover, the patterned mask layer 15 could be comprised of multiple layers of material. Thus, the particular form and composition of the patterned mask layer 15, and the manner in which it is made, should not be considered a limitation of the present invention. In the case where the patterned mask layer 15 is comprised of one or more hard mask layers, such layers may be formed by performing a variety of known processing techniques, e.g., CVD, ALD, etc., and the thickness of such layer(s) may vary depending upon the particular application. In the illustrative embodiment depicted herein, the layer 16 is a layer of polysilicon, while the layer 18 is comprised of silicon dioxide.

Figure 1B:
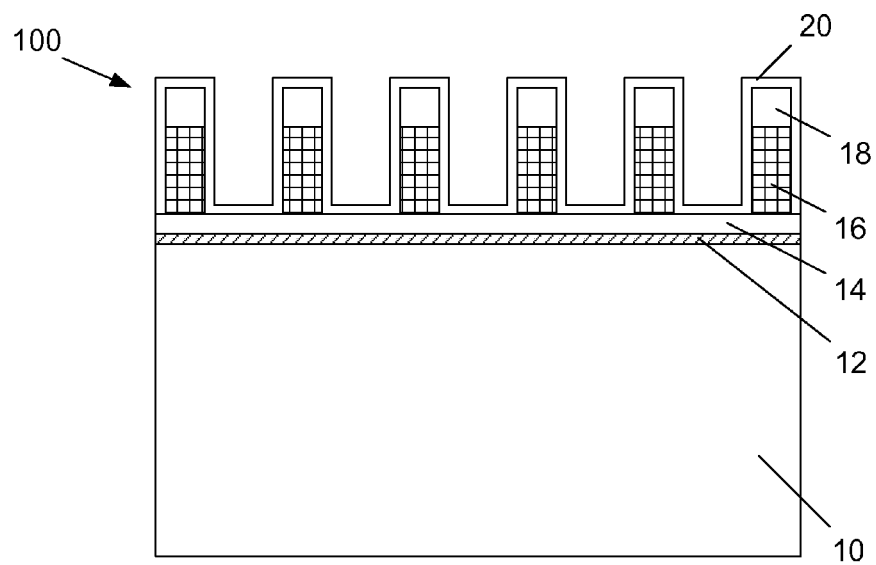

Next, as shown in FIG. 1B, a conformal deposition process, e.g., an ALD process, is performed to form a layer of spacer material 20 on the device 100. In one illustrative embodiment, the layer of spacer material 20 may be comprised of silicon dioxide, SiCN, etc., and it may have a thickness that falls within the range of about 2-4 nm.

Figure 1C:
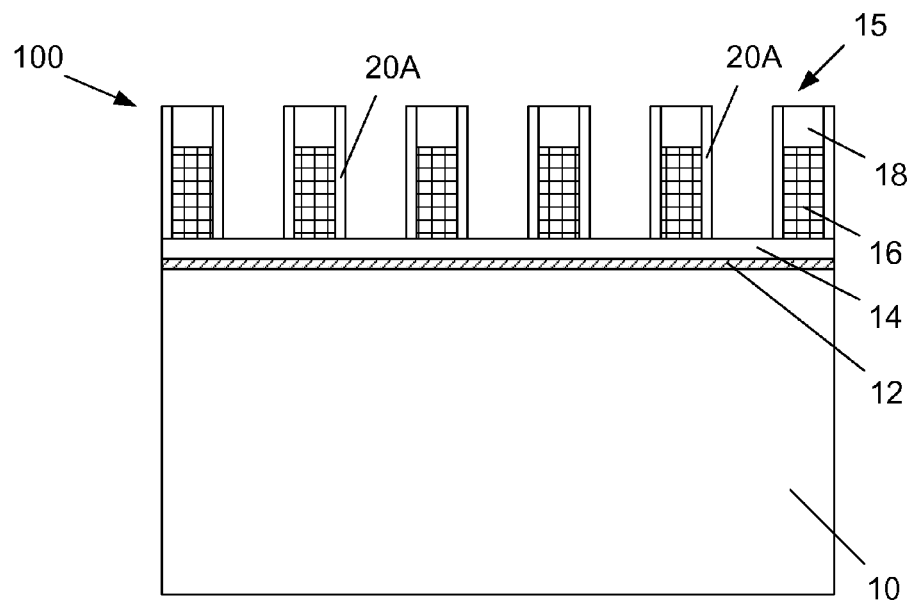

Then, as shown in FIG. 1C, an anisotropic etching process is performed on the layer of spacer material 20 to thereby define spacers 20A positioned adjacent the features of the patterned mask layer 15.

Figure 1D:
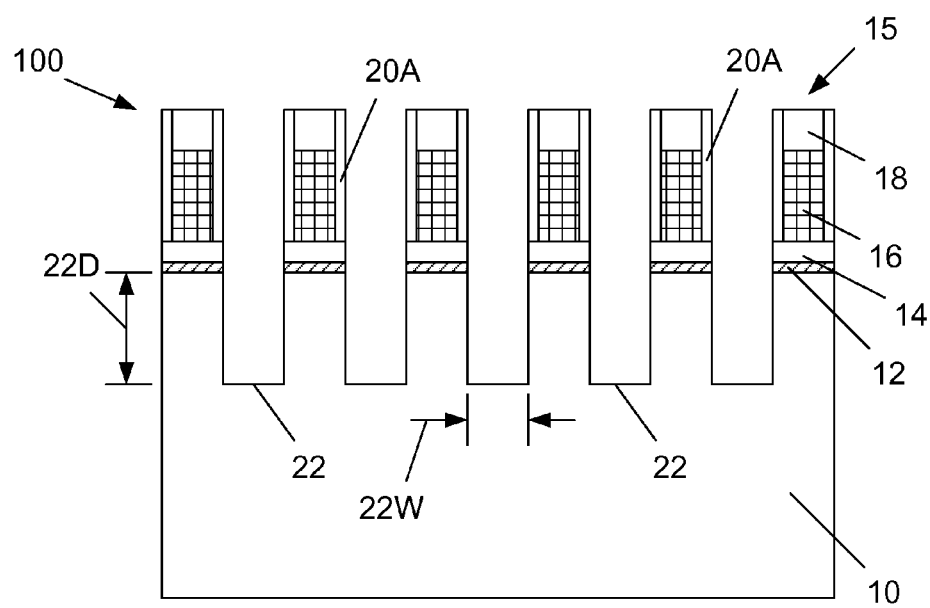

Next, as shown in FIG. 1D, one or more etching processes, such as dry or wet etching processes, are performed on the substrate 10 through the patterned mask layer 15 to form a plurality of first trenches 22. The overall size, shape and configuration of the trenches 22 may vary depending on the particular application, and the manner in which they are formed may also vary. In one example, the trenches 22 may have a vertical depth 22D that ranges from about 50-300 nm relative to the surface of the substrate 10. Similarly, the lateral width 22W of the trenches 22 may fall within a range of about 15-50 nm. In the examples depicted herein, the trenches 22 are formed by performing an anisotropic etching process that results in the trenches 22 having a schematically depicted, generally rectangular configuration. However, as will be recognized by those skilled in the art after a complete reading of the present application, the trenches 22 may be formed using a variety of techniques. Thus, the size and configuration of the trenches 22, and the manner in which they are made, should not be considered a limitation of the present invention. For ease of disclosure, only the substantially rectangular trenches 22 will be depicted in the subsequent drawings.

Figure 1E:
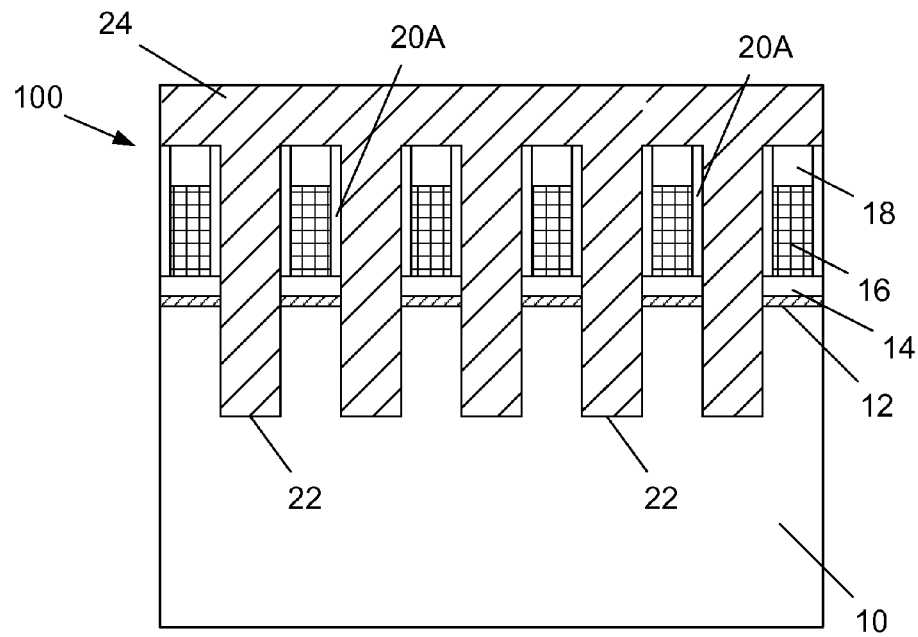

Then, as shown in FIG. 1E, a first stress-inducing material 24 is formed in the trenches 22 of the device 100. The first stress-inducing material 24 may be formed so as to induce a tensile, compressive or neutral stress. The absolute value of the compressive stress or tensile stress for the first stress-inducing material 24 will vary depending upon the particular application, e.g., it may fall within the range of about 0.1-2 GPa. The first stress-inducing material 24 may be comprised of a variety of different materials, such as, for example, silicon nitride, hafnium silicate, etc., and it may be formed by performing a variety of techniques, e.g., CVD, ALD, etc. In one illustrative embodiment, the first stress-inducing material 24 may be a layer of silicon nitride that is formed by performing a CVD process. The manner in which the first stress-inducing material 24 may be formed so as to impart the desired tensile, compressive or neutral stress is well known to those skilled in the art. The first stress-inducing material 24 may have the desired stress level directly as a result of the process of formation (intrinsic stress) or as a result of stress being thermally induced (a material deposited typically at an elevated temperature, having a thermal expansion coefficient substantially different from that of the substrate), or a combination of intrinsic and thermally-induced stress.

Figure 1F:
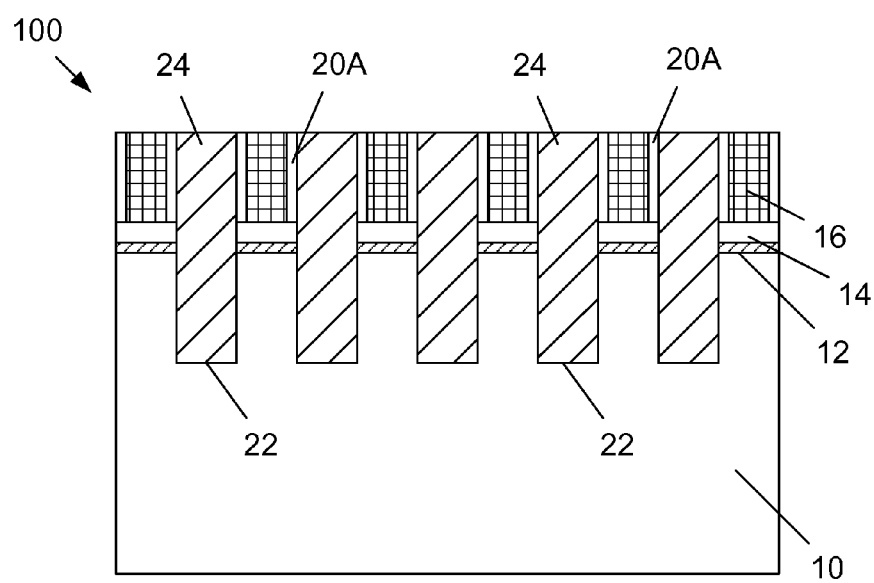

FIG. 1F depicts the device 100 after a chemical mechanical polishing (CMP) process has been performed on the first stress-inducing material 24 that stops on the layer 16, thereby exposing the layer 16 for further processing.

Figure 1G:
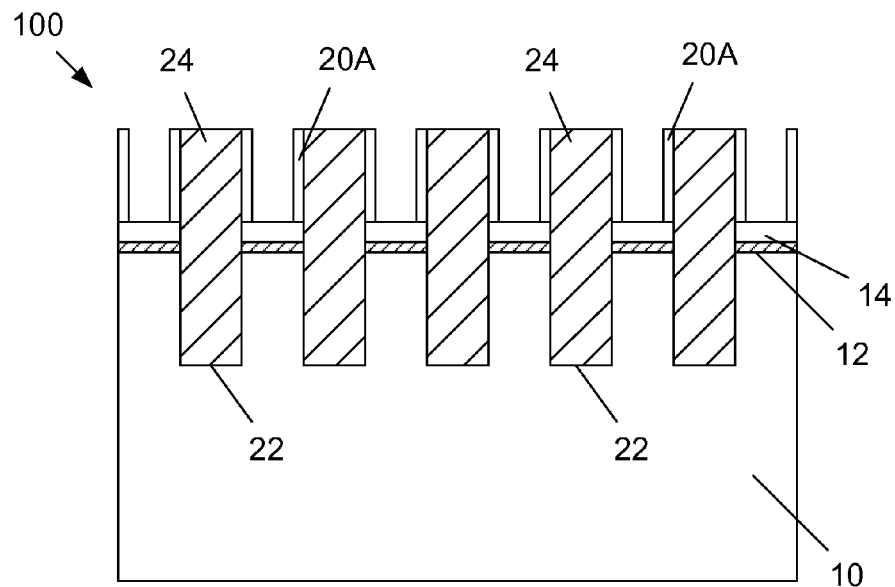

FIG. 1G depicts the device 100 after an etching process has been performed to selectively remove the exposed layer 16.

Figure 1H:
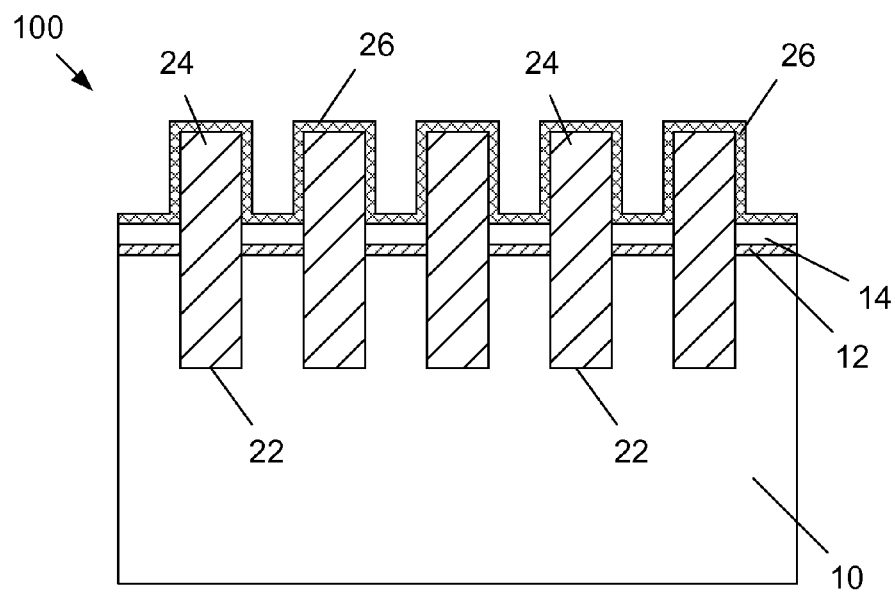

FIG. 1H depicts the device 100 after several process operations have been performed. First, in one embodiment, an optional etching process was performed to remove the spacers 20A (see FIG. 1G). Alternatively, if desired, the spacers 20A may be left in position. For purposes of this disclosure, the spacers 20A will be depicted as being removed. After the spacers 20A have been removed, a conformal deposition process, e.g., an ALD process, is performed to form a layer of spacer material 26 on the device 100. In one illustrative embodiment, the layer of spacer material 26 may be comprised of silicon dioxide, SiCN, etc., and it may have a thickness that falls within the range of about 2-4 nm.

Figure 1I:
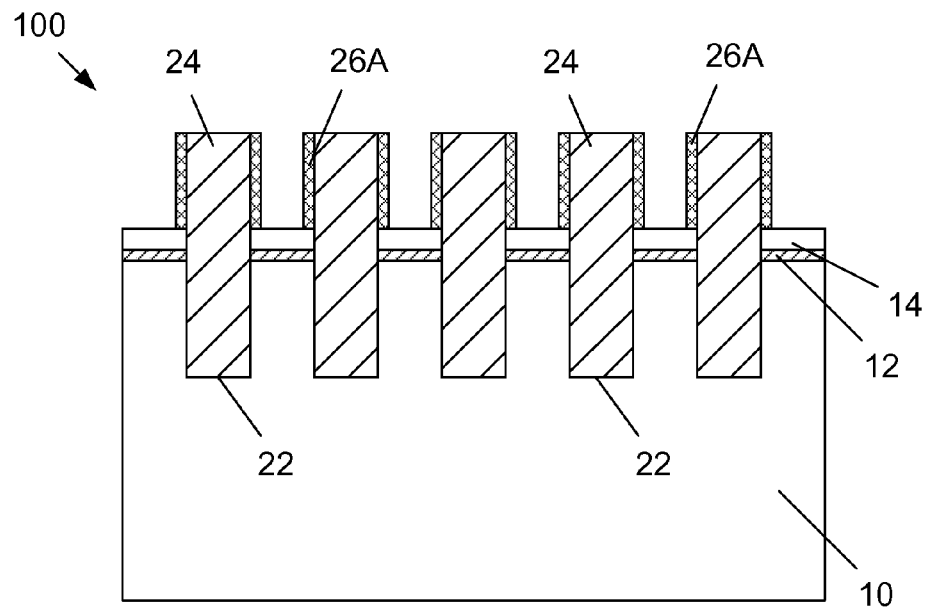

Then, as shown in FIG. 1I, an anisotropic etching process is performed on the layer of spacer material 26 to thereby define spacers 26A positioned adjacent the portions of the first stress-inducing material 24 that were previously formed on the device 100.

Figure 1J:
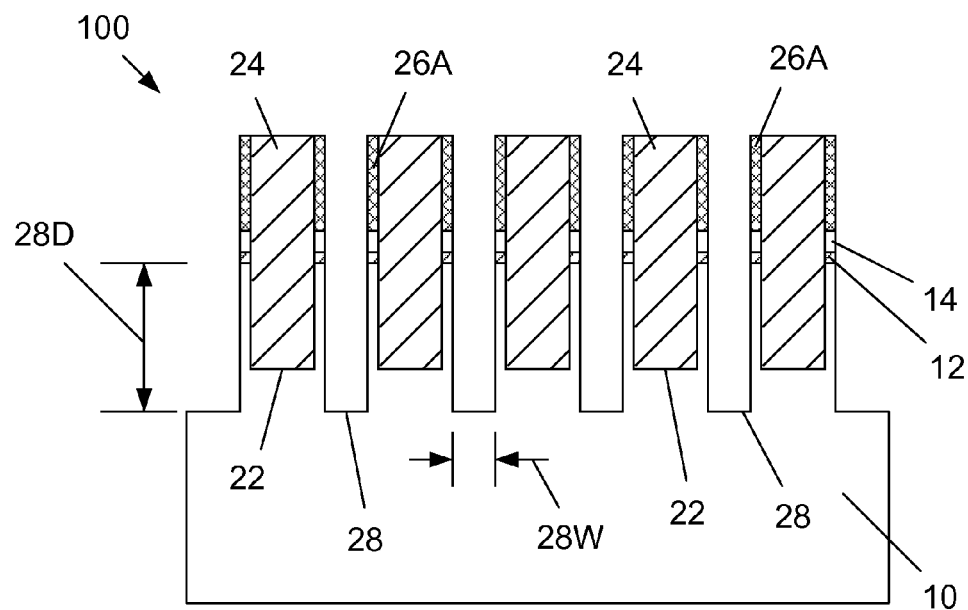

Next, as shown in FIG. 1J, one or more etching processes, such as dry or wet etching processes, are performed on the substrate 10 to form a plurality of second trenches 28. The overall size, shape and configuration of the trenches 28 may vary depending on the particular application, and the manner in which they are formed may also vary. In one example, the trenches 28 may have a vertical depth 28D that ranges from about 50-300 nm relative to the surface of the substrate 10. Similarly, the lateral width 28W of the trenches 28 may fall within a range of about 15-50 nm. In the examples depicted herein, the trenches 28 are formed by performing an anisotropic etching process that results in the trenches 28 having a schematically depicted, generally rectangular configuration. However, as will be recognized by those skilled in the art after a complete reading of the present application, the trenches 28 may be formed using a variety of techniques. Thus, the size and configuration of the trenches 28, and the manner in which they are made, should not be considered a limitation of the present invention. For ease of disclosure, only the substantially rectangular trenches 28 will be depicted in the subsequent drawings.

Additionally, the trenches 22, 28 may or may not have the same depth or width, depending upon the desired characteristics to be imparted to the device 100 and the nature of the stress-inducing material to be formed in the trenches 22, 28. In general, all other things being equal, the absolute level of compressive stress in a compressive stress-inducing material is greater than the absolute level of tensile stress in a tensile stress-inducing material. Thus, for constant width trenches, to impart the same desired absolute stress value on a fin, the trenches where compressive stress-inducing material may be formed have a shallower depth than the trenches where a tensile stress-inducing material will be formed. Accordingly, the width and depth of the trenches 22, 28 may be varied to achieve desired operation characteristics for the final device 100.

Figure 1K:
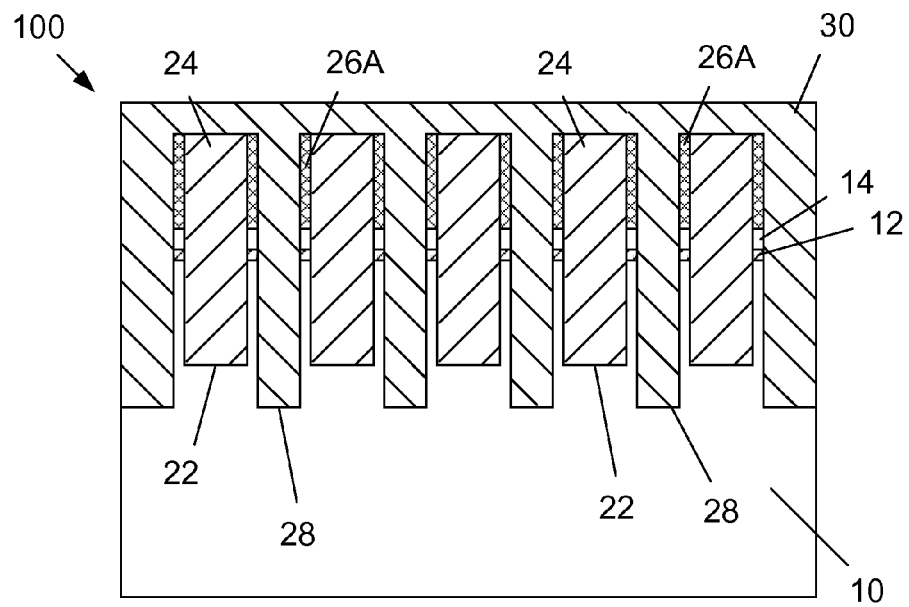

Then, as shown in FIG. 1K, a second stress-inducing material 30 is formed in the trenches 28 of the device 100. The second stress-inducing material 30 may be formed so as to induce a tensile, compressive or neutral stress. The absolute value of the compressive stress or tensile stress for the second stress-inducing material 30 will vary depending upon the particular application, e.g., it may fall within the range of about 0.1-2 GPa. The second stress-inducing material 30 may be comprised of a variety of different materials, such as, for example, silicon nitride, hafnium silicate, etc., and it may be formed by performing a variety of techniques, e.g., CVD, ALD, etc. In one illustrative embodiment, the second stress-inducing material 30 may be a layer of silicon nitride that is formed by performing a CVD process. The manner in which the second stress-inducing material 30 may be formed so as to impart the desired tensile, compressive or neutral stress is well known to those skilled in the art. The second stress-inducing material 30 may have the desired stress level directly as a result of the process of formation (intrinsic stress) or as a result of stress being thermally induced (a material deposited typically at an elevated temperature, having a thermal expansion coefficient substantially different from that of the substrate), or a combination of intrinsic and thermally-induced stress.

In one embodiment, the first stress-inducing material 24 and the second stress-inducing material 30 should be formed with different stress characteristics. For example, if the first stress-inducing material 24 is formed with a tensile stress, then the second stress-inducing material 30 should be formed so as to exhibit a compressive or neutral stress. As another example, if the first stress-inducing material 24 is formed with a neutral stress, then the second stress-inducing material 30 should be formed so as to exhibit a compressive or tensile stress. Simply put, of the three possible stressed conditions for the stress-inducing layers 24, 30—tensile, neutral or compressive—one of the stress-inducing materials is formed so as to exhibit one of the three stressed conditions while the other of the stress-inducing materials is formed so as to exhibit one of the other two stressed conditions. In other embodiments, the first stress-inducing material 24 and the second stress-inducing material 30 may be formed so as to exhibit the same type of stress, e.g., both being tensile stressed layers, wherein the magnitude of the stress level in the first stress-inducing material 24 and the second stress-inducing material 30 are different, e.g., the material 24 has a greater tensile stress than the tensile stress in the material 30.

Figure 1L:
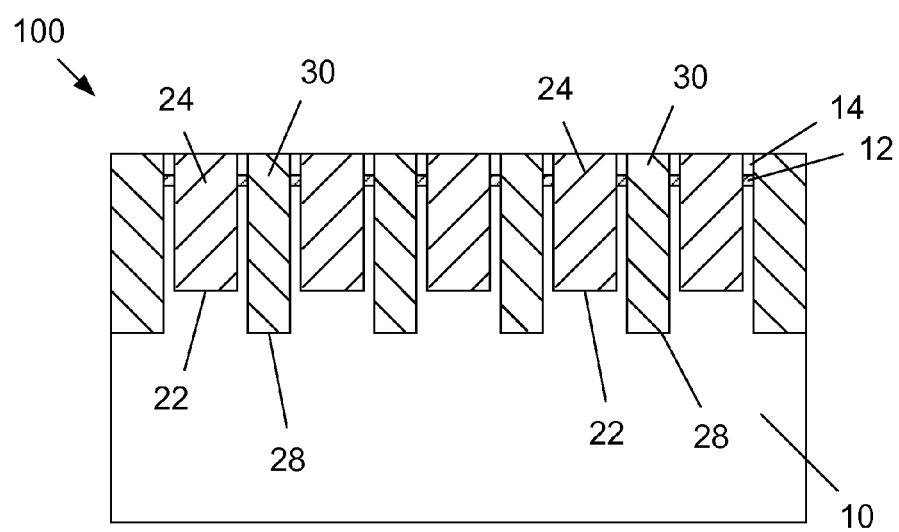

FIG. 1L depicts the device 100 after a chemical mechanical polishing (CMP) process has been performed on the second stress-inducing material 30 that stops on the surface of the layer 14.

Figure 1M:
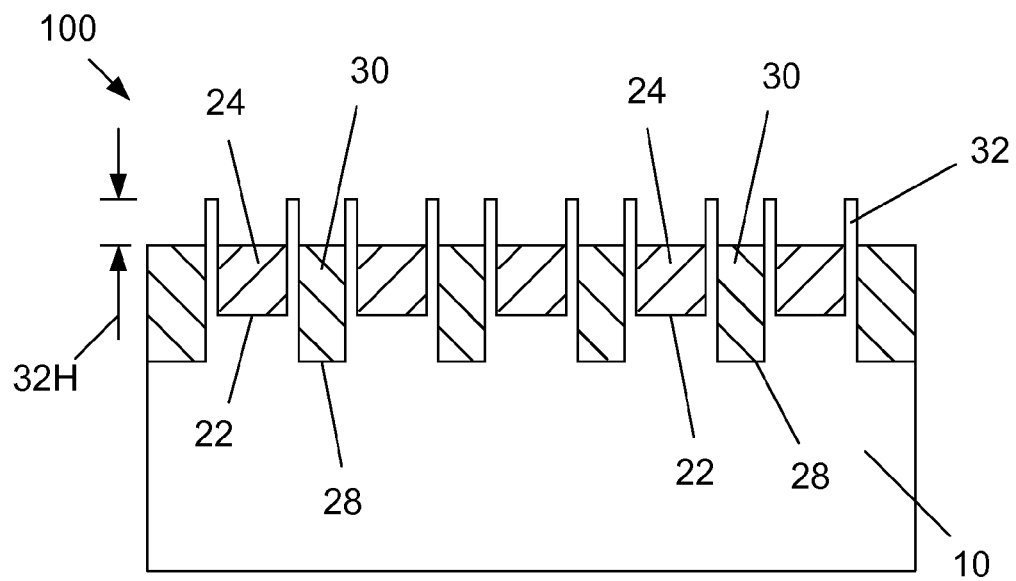

FIG. 1M depicts the device 100 after one or more etching processes have been performed to remove the layers 14, 12 and to recess the stress-inducing layers 24, 30 to effectively define the exposed fins 32 for the device 100. The overall size, shape and configuration of the fins 32 may vary depending upon the particular application. In one illustrative embodiment, the final desired height 32H of the fins 32 may be approximately 10-40 nm, and the lateral width of the fins 32 may be on the order of about 7-18 nm.

Figure 1N:
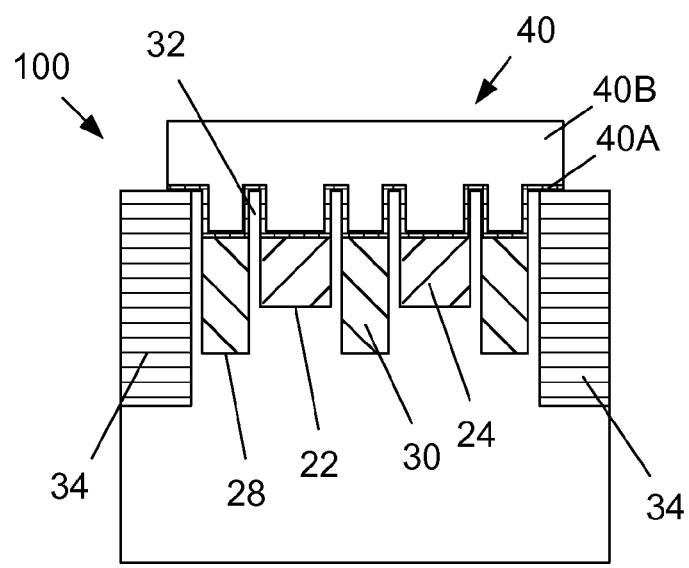

FIG. 1N depicts the device 100 after a gate structure 40 is formed for the device 100 using well known techniques. An illustrative isolation region 34 that has been formed in the substrate 10 is also depicted in FIG. 1N. In one illustrative embodiment, the schematically depicted gate structure 40 includes an illustrative gate insulation layer 40A and an illustrative gate electrode 40B. A gate cap layer (not shown) may also be formed above the illustrative gate electrode layer 40B. The gate insulation layer 40A may be comprised of a variety of different materials, such as, for example, silicon dioxide, a so-called high-k (k greater than 7) insulation material, etc. Similarly, the gate electrode 40B may also be of a material such as polysilicon or amorphous silicon, or it may be comprised of one or more metal layers that act as the gate electrode 40B. As will be recognized by those skilled in the art after a complete reading of the present application, the gate structure 40 of the device 100 depicted in the drawings, i.e., the gate insulation layer 40A and the gate electrode 40B, is intended to be representative in nature. That is, the gate structure 40 may be comprised of a variety of different materials and it may have a variety of configurations, and the gate structure 40 may be made using either so-called "gate-first" or "gate-last" techniques. In one illustrative embodiment, an oxidation process may be performed to form a gate insulation layer 40A comprised of silicon dioxide. Thereafter, the gate electrode material 40B and the cap layer material (not shown) may be deposited above the device 100 and the layers may be patterned using known photolithographic and etching techniques. The gate cap layer may be made of a variety of materials such as, for example, silicon nitride. Typically, sidewall spacers comprised of, for example, silicon nitride, formed adjacent the gate structure 40 protect and electrically isolate the gate structure 40, however, such spacers are not shown in FIG. 1N so as not to obscure the present inventions.

As can be seen in FIG. 1N, the device 100 includes trenches 22, 28 having stress-inducing materials 24, 30 that induce different type stresses on the channel of the device 100. As noted earlier, the stresses induced by the materials 24, 30, respectively, in the trenches 22, 28 may be a compressive stress, a tensile stress or a neutral stress. In the depicted example, the trenches 22, 28 have different widths and different depths, although that is not required in all configurations of the inventions disclosed herein. Stated another way, the volume of the first stress-inducing material 24 positioned adjacent the fin 32 may be different than the volume of the second stress-inducing material 30 positioned adjacent the opposite side of the fin 32.

Figure 1O:
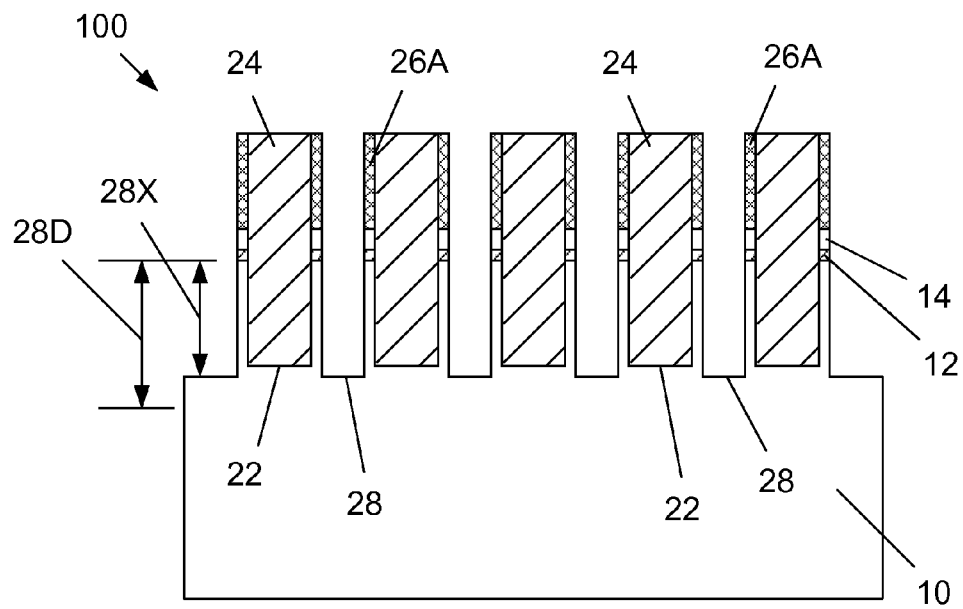
Figure 1P:
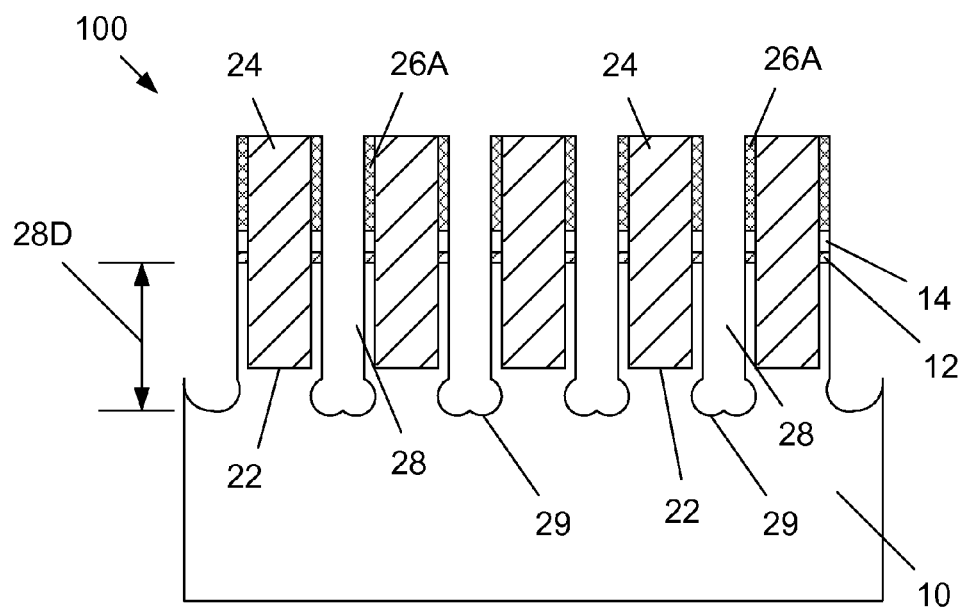
Figure 1Q:
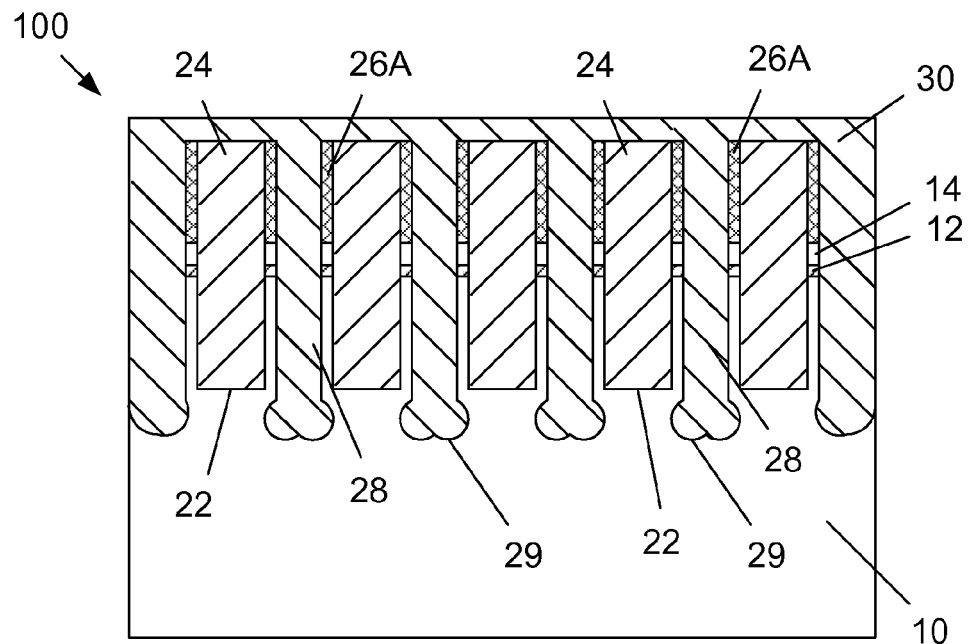
Figure 1R:
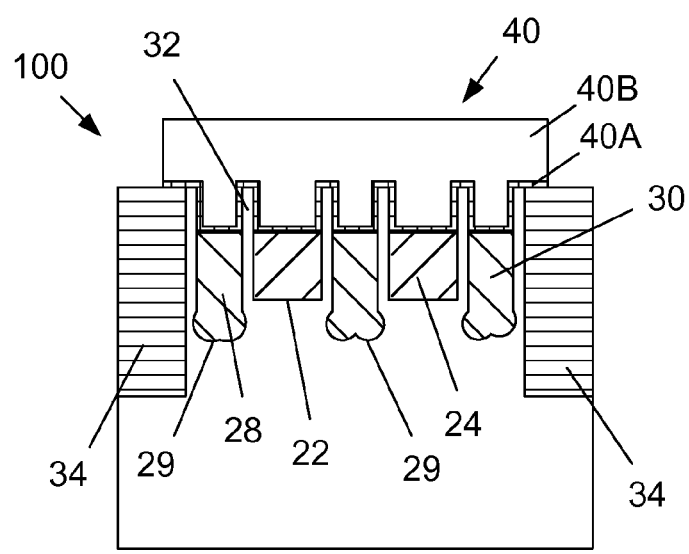

FIGS. 1O-1R depict another variant of the methods and devices disclosed herein. FIG. 1O depicts the device 100 at the point of fabrication wherein the second trenches 28 are being formed in the substrate 10, i.e., a point of fabrication that approximately corresponds to that depicted in FIG. 1J. However, in this embodiment, the etching process that is performed to form the trenches 28 is modified such that a first portion of the etching process that is performed to form the trenches 28 is an anisotropic etching process and a second portion of the etching process is an isotropic etching process. FIG. 1O depicts the device 100 at a point where the first anisotropic portion of the trench etch process has been performed so as to initially form the second trenches 28 to a depth 28X that is less than the desired final depth 28D of the second trenches 28. FIG. 1P depicts the device 100 at a point of fabrication wherein the second isotropic portion of the etching process has been performed which results in a schematically depicted rounded and widened bottom portion 29 of the trenches 28. Then, as shown in FIG. 1Q, the second stress-inducing material 30 is formed in the trenches 28 (with the rounded and widened bottom portions 29) of the device 100. FIG. 1R depicts the device 100 after the previously described gate structure 40 has been formed on the device 100.

Figure 1S:
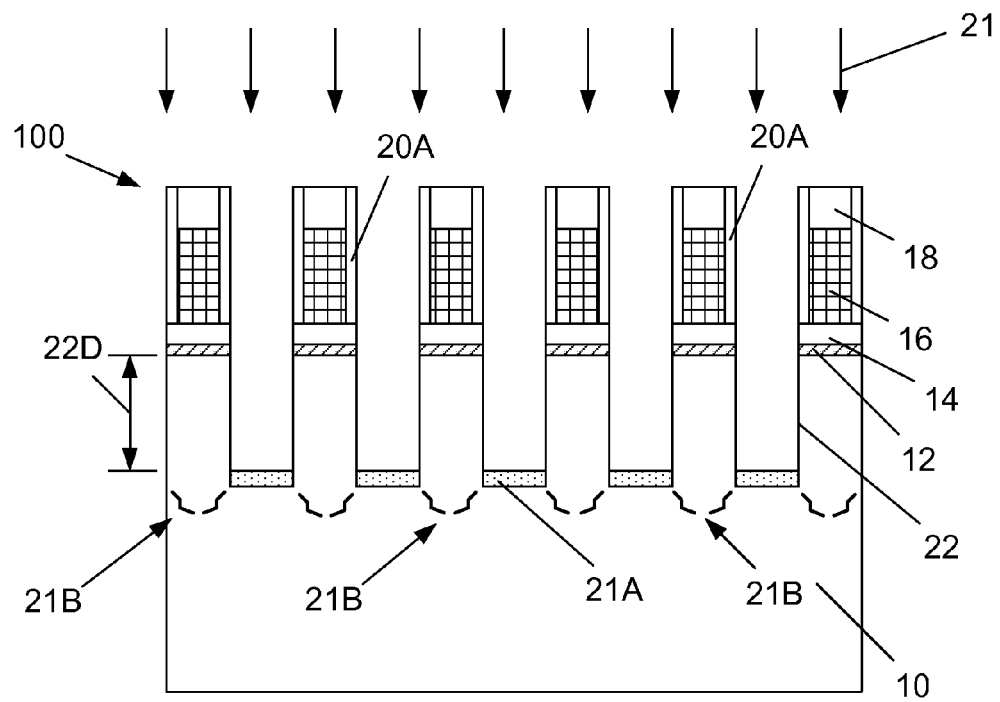
Figure 1T:
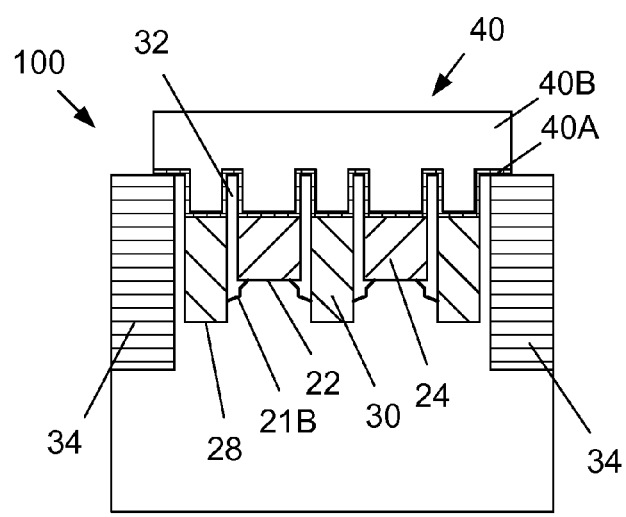

FIGS. 1S-1T depict yet another variant of the methods and devices disclosed herein. FIG. 1S depicts the device 100 at the point of fabrication wherein the first trenches 22 have been formed in the substrate 10, i.e., a point of fabrication that approximately corresponds to that depicted in FIG. 1D. However, in this embodiment, an ion implant process 21 may be performed to form implant regions 22 in the substrate 10 proximate the bottom of the trenches 22. The ion implant process 21 is performed using relatively large atoms, such as, for example, xenon, germanium, argon, etc. In one illustrative embodiment, the implant regions 21A may be formed using any of the above dopant species at a dopant dose of about $3^{15}$ ions/cm$^2$ and at an energy level of about 2-10 keV. In this illustrative example, the implant regions 21A have a target depth of about 20-30 nm. Ultimately, as a result of the heating of the device 100 as processing continues after the implant regions 21A are initially formed, the relatively large atoms in the implant regions 21A will tend to migrate and induce schematically depicted defects 21B in the substrate 10. If desired, a separate dedicated heating step may be performed at some point in the process flow to insure the formation of the defects 21B. The defects 21B are depicted in FIG. 1S for purposes of explanation only as they may not be formed at this point in the illustrative process flow described herein. The defects 21B tend to de-couple the fins of the device 100 from the remaining portions of the substrate 10, or at least make the connection between the fins and the substrate 10 less rigid, thereby permitting more effective stress engineering of the channel region of the device 100, i.e., they will effectively enable more stress to be applied to the fins of the device 100. Of course, as will be recognized by those skilled in the art after a complete reading of the present application, the implant regions 21A need not be formed in all embodiments of the various inventions disclosed herein. FIG. 1T depicts the device 100 after the previously described gate structure 40 has been formed on the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device, comprising:
   forming first and second spaced-apart trenches that extend at least partially into a semiconducting substrate, said first and second trenches defining a fin structure for said device;
   forming a first stress-inducing material having a first type of stress in said first trench;
   forming a second stress-inducing material in said second trench, said second stress-inducing material having a second stress that is a different type than said first type of stress; and
   forming a gate structure around a portion of said fin structure.

2. The method of claim 1, wherein said first stress-inducing material has one of a compressive stress, a tensile stress or a neutral stress.

3. The method of claim 1, wherein said second stress-inducing material has one of a compressive stress, a tensile stress or a neutral stress.

4. The method of claim 1, wherein said first stress-inducing material has a compressive stress and said second stress-inducing material has a tensile stress or a neutral stress.

5. The method of claim 1, wherein said first stress-inducing material has a tensile stress and said second stress-inducing material has a compressive stress or a neutral stress.

6. The method of claim 1, wherein said first stress-inducing material has a neutral stress and said second stress-inducing material has a compressive stress or a tensile stress.

7. The method of claim 1, wherein said gate structure comprises a gate insulation layer comprised of a high-k insulating material and a gate electrode comprised of at least one layer of metal.

8. The method of claim 1, wherein said gate structure comprises a gate insulation layer comprised of silicon dioxide and a gate electrode comprised of polysilicon or amorphous silicon.

9. The method of claim 1, wherein said first and second trenches have different depths relative to an upper surface of said substrate.

10. The method of claim 1, wherein said first and second trenches have different lateral widths.

11. The method of claim 9, wherein said first and second trenches have different lateral widths.

12. The method of claim 1, wherein said first and second stress-inducing materials are comprised of the same material.

13. The method of claim 1, further comprising, prior to forming said first stress-inducing material, performing an ion implant process to define an implant region comprised of one of germanium, argon or xenon in said substrate proximate a bottom of said first trench.

14. The method of claim 1, wherein forming said second trench comprises performing an etching process comprised of a first anisotropic etching process followed by performing a second isotropic etching process to define a rounded bottom portion of said second trench.

15. A method of forming a device, comprising:
   forming a patterned mask layer above a semiconducting substrate;
   performing at least one first etching process through said patterned mask layer to form a first trench in said substrate;
   forming a first stress-inducing material having a first type of stress in said first trench;
   removing a portion of said first patterned masking layer;
   after removing said portion of said first patterned masking layer, performing at least one second etching process to form a second trench in said substrate, wherein said first and second trenches define a fin structure for said device;
   forming a second stress-inducing material in said second trench, said second stress-inducing material having a second stress that is a different type than said first type of stress;
   performing at least one process operation to reduce a thickness of said first and second stress-inducing materials so as to expose a desired portion of said fin structure; and
   forming a gate structure around a portion of said exposed fin structure.

16. The method of claim 15, wherein forming said first stress-inducing material comprises forming said first stress-inducing material layer such that it has one of a compressive stress, a tensile stress or a neutral stress.

17. The method of claim 15, wherein forming said second stress-inducing material comprises forming said second stress-inducing material layer such that it has one of a compressive stress, a tensile stress or a neutral stress.

18. The method of claim 15, wherein said first stress-inducing material has a compressive stress and said second stress-inducing material has a tensile stress or a neutral stress.

19. The method of claim 15, wherein said first stress-inducing material has a tensile stress and said second stress-inducing material has a compressive stress or a neutral stress.

20. The method of claim 15, wherein said first stress-inducing material has a neutral stress and said second stress-inducing material has a compressive stress or a tensile stress.

21. The method of claim 15, wherein said first and second trenches have different depths relative to an upper surface of said substrate.

22. The method of claim 15, wherein said first and second trenches have different lateral widths.

23. The method of claim 21, wherein said first and second trenches have different lateral widths.

24. The method of claim 15, further comprising, prior to forming said first stress-inducing material, performing an ion implant process to define an implant region comprised of one of germanium, argon or xenon in said substrate proximate a bottom of said first trench.

25. The method of claim 15, wherein forming said second trench comprises performing an etching process comprised of a first anisotropic etching process followed by performing a second isotropic etching process to define a rounded bottom portion of said second trench.

* * * * *